US012571767B2

(12) United States Patent
Takahashi et al.

(10) Patent No.: US 12,571,767 B2
(45) Date of Patent: Mar. 10, 2026

(54) EDDY CURRENT SENSOR, POLISHING APPARATUS, AND FILM THICKNESS DETECTION METHOD

(71) Applicant: EBARA CORPORATION, Tokyo (JP)

(72) Inventors: Taro Takahashi, Tokyo (JP); Shinpei Tokunaga, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 145 days.

(21) Appl. No.: 18/545,448

(22) Filed: Dec. 19, 2023

(65) Prior Publication Data

US 2024/0210353 A1     Jun. 27, 2024

(30) Foreign Application Priority Data

Dec. 26, 2022     (JP) ................................. 2022-208003

(51) Int. Cl.
*G01N 27/90*        (2021.01)
*G01N 27/02*        (2006.01)
*H01L 21/66*        (2006.01)

(52) U.S. Cl.
CPC ....... *G01N 27/9006* (2013.01); *G01N 27/023* (2013.01); *G01N 27/9046* (2013.01); *H01L 22/12* (2013.01)

(58) Field of Classification Search
CPC ...................... G01N 27/90–9093; H01L 22/12
USPC ................................. 324/230, 229, 232, 239
See application file for complete search history.

(56) References Cited

U.S. PATENT DOCUMENTS

| | | | | |
|---|---|---|---|---|
| 7,670,206 B2 * | 3/2010 | Togawa | .................. | B24B 49/16 |
| | | | | 451/10 |
| 2013/0260645 A1 | 10/2013 | Takahashi et al. | | |
| 2017/0259394 A1 * | 9/2017 | Takahashi | ......... | H01L 21/67092 |
| 2019/0193242 A1 | 6/2019 | Takahashi et al. | | |
| 2020/0147747 A1 * | 5/2020 | Takahashi | ............. | B24B 49/105 |

FOREIGN PATENT DOCUMENTS

| | | |
|---|---|---|
| JP | 2011-023579 A | 2/2011 |
| JP | 2013-211354 A | 10/2013 |

\* cited by examiner

*Primary Examiner* — Alesa Allgood
*Assistant Examiner* — Rahul Maini
(74) *Attorney, Agent, or Firm* — BakerHostetler

(57) ABSTRACT

The eddy current sensor includes a first detector that detects an eddy current generated in a semiconductor wafer WH and a second detector that detects the eddy current. The first detector includes a first exciting coil configured to generate the eddy current and a first detecting coil configured to detect the eddy current. The first exciting coil and the first detecting coil are air-core coils. The second detector includes second exciting coil configured to generate the eddy current and second detecting coil configured to detect the eddy current. The second exciting coil and the second detecting coil are coils with a magnetic core.

10 Claims, 13 Drawing Sheets

Fig. 8

Fig. 9A
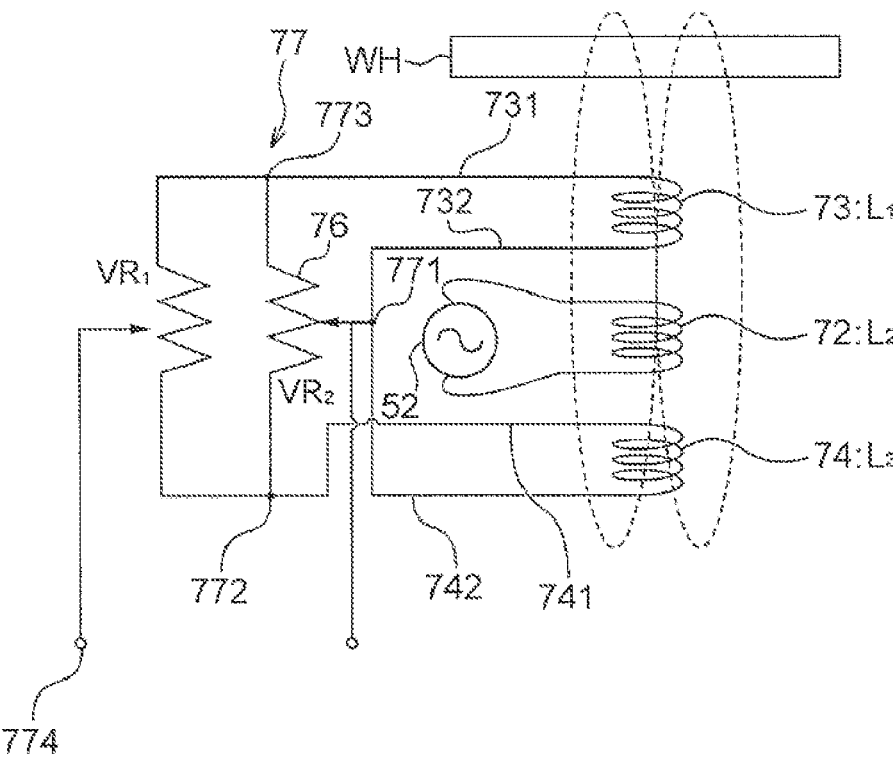
Fig. 9B
Fig. 9C
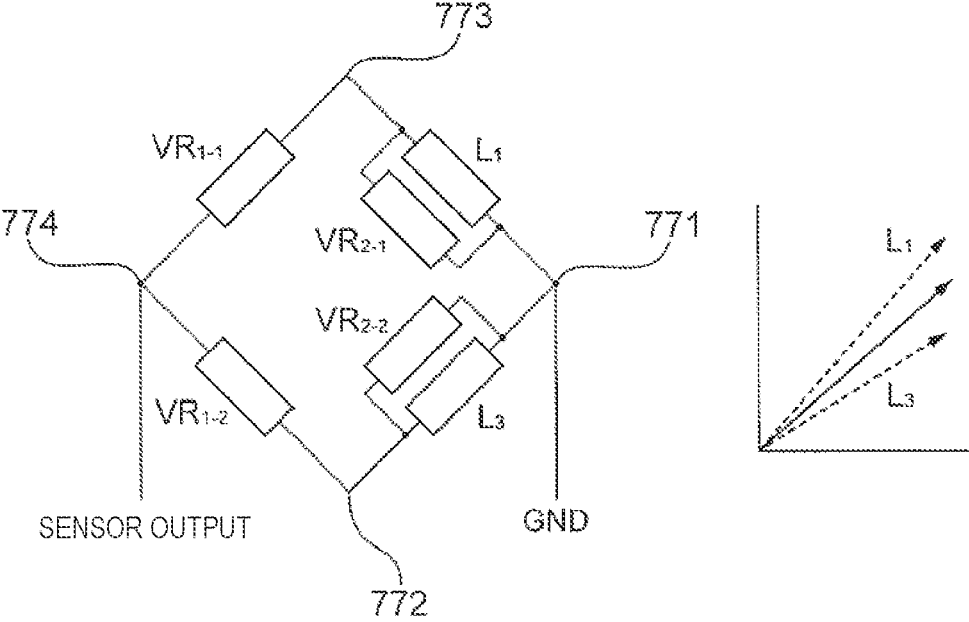

EDDY CURRENT SENSOR, POLISHING APPARATUS, AND FILM THICKNESS DETECTION METHOD

TECHNICAL FIELD

The present invention relates to an eddy current sensor, and to a polishing apparatus and a film thickness detection method using the eddy current sensor.

BACKGROUND ART

Eddy current sensors are used for applications such as film thickness measurement and displacement measurement. Hereinafter, film thickness measurement will be taken as an example to describe an eddy current sensor. An eddy current sensor for film thickness measurement is used in a semiconductor device fabrication step (polishing step), for example. In the polishing step, the eddy current sensor is used as follows. As the level of integration in semiconductor devices advances, circuit interconnects are becoming finer, and spacing between interconnects is becoming narrower. Accordingly, it is necessary to planarize a surface of a semiconductor wafer, which is a polishing target. It is therefore a common practice to polish the wafer by a polishing apparatus as a way of planarization.

A polishing apparatus is provided with a polishing table for holding a polishing pad for polishing the polishing target and a top ring for holding and pressing the polishing target against the polishing pad. The polishing table and the top ring are each rotated by a drive (a motor, for example). A liquid containing a polishing agent (slurry) is made to flow onto the polishing pad, and by pressing the polishing target held by the top ring against the polishing pad, the polishing target is polished.

If the polishing of the polishing target by the polishing apparatus is insufficient, circuits will not be insulated from each other, possibly leading to a short circuit. On the other hand, other problems may occur if the polishing target is over-polished, such as a rise in resistance values because of a decrease in the cross-sectional area of the interconnects, or the interconnects themselves may be completely removed and the circuit itself may not be formed. If the polishing target is a thin polishing target such as, for example, fine copper (Cu) interconnects rather than what is called bulk, which is widely present on the surface of the polishing target, detecting a film thickness of the polishing target is difficult. Consequently, it is desirable to improve detection sensitivity.

Japanese Patent Laid-Open No. 2011-23579 describes a technology that uses two sensors A and B with different sensitivities to monitor an output from start of polishing until the sensitivity of sensor A is lost, and after detecting a polishing endpoint, switches to sensor B to confirm that there is no residual metal film on a wafer. The sensors A and B are disposed at different positions on a table. To detect a metal thin film as polishing progresses, it is necessary to increase the sensor sensitivity (magnitude of a sensor output). To increase the sensor sensitivity, Japanese Patent Laid-Open No. 2011-23579 proposes raising an oscillation frequency of an eddy current sensor, increasing an amplification level of an internal circuit in the eddy current sensor, or raising an excitation voltage of the eddy current sensor.

These methods for increasing the sensor sensitivity have the following problems. The oscillation frequency of the eddy current sensor needs to be set lower than a coil resonance frequency, which is determined by an inductance and capacitance of a coil itself. If the oscillation frequency is set close to the resonance frequency, there is a problem with stability of characteristics. When the amplification level of the internal circuit in the eddy current sensor is raised, there is a problem of increased circuit noise effects. Furthermore, when the excitation voltage of the eddy current sensor is raised, there is a problem with the stability of the characteristics.

To address these problems, Japanese Patent Laid-Open No. 2013-211354 discloses a configuration formed from an inner sensor coil 60A and an outer sensor coil 60B arranged concentrically. The outer sensor coil 60B functions as a sensor with low sensitivity that can accurately detect a residual film on an entire polished surface of a semiconductor wafer. The sensor coil 60B can stably detect a polishing endpoint.

The inner sensor coil 60A functions as a sensor with high sensitivity that can detect a metal film even when a target metal film is thin or an area of the metal film is small. The sensor coil 60A can detect a detailed residual film distribution on a polished surface of a semiconductor wafer WH (substrate) and detect a thin film in an edge portion of the semiconductor wafer WH (paragraph [0075] in Japanese Patent Laid-Open No. 2013-211354). The sensor coil 60A and the sensor coil 60B are coils wound in a solenoid or a spiral around a nonmagnetic bobbin. However, the coils indicated in Japanese Patent Laid-Open No. 2013-211354 have a low detection output for fine copper (Cu) interconnects, making it difficult to detect fine copper interconnects.

One aspect of the present invention has been made to address such issues, and an object thereof is to provide an eddy current sensor with a larger detection output than the technology of the related art, even when detecting fine metal.

SUMMARY OF INVENTION

To solve the above problem, a first aspect adopts a configuration of an eddy current sensor including a first detector that detects an eddy current generated in a detection target and a second detector that detects the eddy current, wherein the first detector includes a first exciting coil configured to generate the eddy current and a first detecting coil configured to detect the eddy current, the first exciting coil and the first detecting coil are air-core coils or coils with a core of a nonmagnetic material, the second detector includes a second exciting coil configured to generate the eddy current and a second detecting coil configured to detect the eddy current, and the second exciting coil and the second detecting coil are coils with a core of a magnetic material.

A second aspect adopts the configuration of the eddy current sensor according to the first aspect, wherein the first detector is located between the detection target and the second detector.

A third aspect adopts the configuration of the eddy current sensor according to the first aspect, wherein the first detector is disposed peripherally around the second detector.

A fourth aspect adopts the configuration of the eddy current sensor according to any one of the first to third aspects, wherein a central axis of the first exciting coil, a central axis of the first detecting coil, a central axis of the second exciting coil, and a central axis of the second detecting coil are aligned.

A fifth aspect adopts the configuration of the eddy current sensor according to any one of the first to fourth aspects, wherein the first exciting coil and the first detecting coil are coils obtained by winding a conductor in a single column with multiple layers or in multiple columns with multiple layers, a column being defined as a direction perpendicular to the detection target and a layer being defined as a direction parallel to the detection target.

A sixth aspect adopts the configuration of the eddy current sensor according to any one of the first to fifth aspects, wherein the core of the magnetic material includes a bottom magnetic material, a central magnetic material provided in a center of the bottom magnetic material, and a peripheral magnetic material provided on a periphery of the bottom magnetic material; the second exciting coil includes a second central exciting coil disposed at the central magnetic material; and the second detecting coil includes a second central detecting coil disposed at the central magnetic material.

A seventh aspect adopts the configuration of the eddy current sensor according to the sixth aspect, wherein the second exciting coil includes a second peripheral exciting coil disposed at the peripheral magnetic material, and the second detecting coil includes a second peripheral detecting coil disposed at the peripheral magnetic material.

An eighth aspect adopts the configuration of the eddy current sensor according to the sixth or seventh aspect, wherein the bottom magnetic material has a rod shape, and the peripheral magnetic material is disposed at both ends of the rod shape.

A ninth aspect adopts the configuration of the eddy current sensor according to any one of the first to eighth aspects, wherein the first exciting coil and the first detecting coil are a same coil, or the second exciting coil and the second detecting coil are a same coil.

A tenth aspect adopts a configuration of a polishing apparatus including: a polishing table to which a polishing pad for polishing the detection target can be attached; a drive configured to rotationally drive the polishing table; a holder configured to hold and press the detection target against the polishing pad; the eddy current sensor according to any one of the first to ninth aspects, the eddy current sensor being disposed inside the polishing table and configured to detect by the first detecting coil or the second detecting coil, the eddy current being formed in the detection target by the first exciting coil or the second exciting coil in association with the rotation of the polishing table; and an endpoint detector configured to detect, from the detected eddy current, a polishing endpoint that indicates an end of polishing of the polishing target.

An eleventh aspect adopts a configuration of a film thickness detection method using the eddy current sensor according to any one of the first to ninth aspects, the film thickness detection method including: obtaining a film thickness by detecting the eddy current with the first detector when an electrical resistance of the detection target is less than a predetermined value; and obtaining the film thickness by detecting the eddy current with the second detector when the electrical resistance of the detection target is greater than the predetermined value.

A twelfth aspect adopts a configuration of a film thickness detection method using the eddy current sensor according to any one of the first to ninth aspects, the film thickness detection method including: obtaining a film thickness by detecting the eddy current with the first detector when the film thickness of the detection target is greater than a predetermined value; and obtaining the film thickness by detecting the eddy current with the second detector when the film thickness of the detection target is less than the predetermined value.

BRIEF DESCRIPTION OF DRAWINGS

FIGS. 3A and 3B are diagrams illustrating a configuration of an eddy current sensor assembly, in which FIG. 3A is a block diagram illustrating the configuration of the eddy current sensor assembly and FIG. 3B is an equivalent circuit diagram of the eddy current sensor assembly;

FIG. 8 is a schematic diagram illustrating an exemplary configuration of a first detector in the eddy current sensor of the present embodiment;

FIGS. 9A to 9C are schematic diagrams illustrating an exemplary connection of each coil in the first detector of the eddy current sensor;

DESCRIPTION OF EMBODIMENTS

Hereinafter, embodiments of the present invention will be described with reference to the drawings. Note that in the following embodiments, identical or corresponding members are denoted with the same signs, and a duplicate description may be omitted. Also, features indicated in each embodiment are also applicable to other embodiments insofar as the embodiments do not contradict each other.

Figure 1:
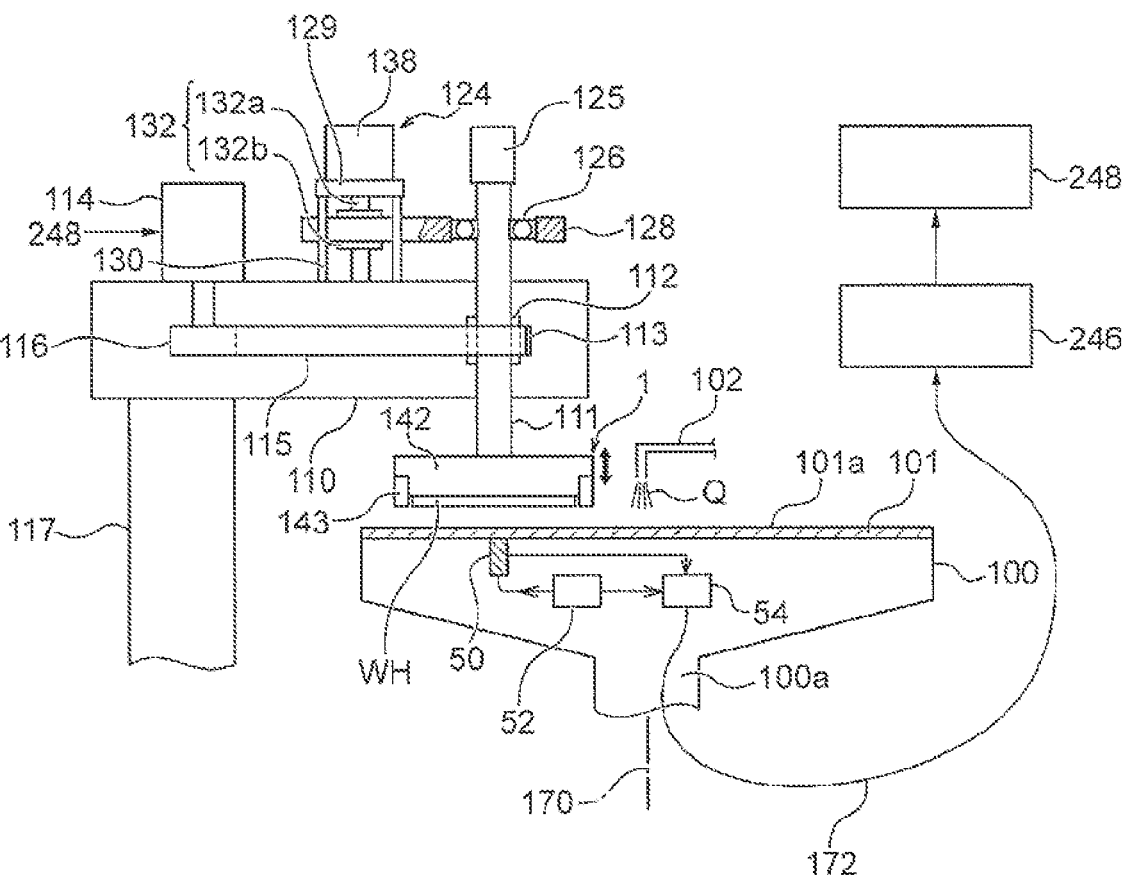
FIG. 1 is a schematic diagram illustrating an overall configuration of a polishing apparatus according to an embodiment of the present invention.

FIG. 1 is a schematic diagram illustrating an overall configuration of a polishing apparatus to which an eddy current sensor 50 according to an embodiment of the present invention is applied. As illustrated in FIG. 1, the polishing apparatus is provided with a polishing table 100 and a top ring 1 (holder) that holds a substrate to be polished, such as a semiconductor wafer WH, against a polishing surface on the polishing table.

A polishing pad 101 for polishing a detection target can be attached to the polishing table 100. The top ring 1 is configured to hold and press the detection target against the polishing pad 101. The eddy current sensor 50 is disposed inside the polishing table 100 and is configured to detect, by a first detecting coil or a second detecting coil, an eddy current formed in the detection target by a first exciting coil or a second exciting coil as the polishing table 100 rotates. An endpoint detector is configured to detect, from the detected eddy current, a polishing endpoint that indicates an end of polishing of the polishing target.

The polishing table 100 is coupled to a motor (not illustrated) that acts as a drive disposed underneath through a table spindle 170, and is capable of rotating about the table spindle 170. The drive is configured to rotationally drive the polishing table. The polishing pad 101 is affixed to a top face of the polishing table 100, and a surface 101a of the polishing pad 101 forms a polishing surface that polishes the semiconductor wafer WH. A polishing liquid supply nozzle 102 is installed above the polishing table 100, such that a polishing liquid Q is supplied onto the polishing pad 101 on the polishing table 100 by the polishing liquid supply nozzle 102. As illustrated in FIG. 1, the eddy current sensor 50 is embedded inside the polishing table 100.

The top ring 1 basically includes a top ring body 142 that presses the semiconductor wafer WH against the polishing surface 101a and a retainer ring 143 that holds outer peripheral edges of the semiconductor wafer WH such that the semiconductor wafer WH does not fly off the top ring.

The top ring 1 is connected to a top ring shaft 111, and the top ring shaft 111 is configured to move up and down with respect to a top ring head 110 by a raising/lowering mechanism 124. By the up and down movement of the top ring shaft 111, the entire top ring 1 is raised or lowered and positioned with respect to the top ring head 110. Note that a rotary joint 125 is attached to a top end of the top ring shaft 111.

The raising/lowering mechanism 124 that moves the top ring shaft 111 and the top ring 1 up and down is provided with a bridge 128 that rotatably supports the top ring shaft 111 through a bearing 126, a ball screw 132 attached to the bridge 128, a support stand 129 supported by a support column 130, and a servo motor 138 provided on the support stand 129. The support stand 129 that supports the servo motor 138 is secured to the top ring head 110 through the support column 130.

The ball screw 132 is provided with a screw shaft 132a coupled to the servo motor 138 and a nut 132b with which the screw shaft 132a engages. The top ring shaft 111 is configured to move up and down as one with the bridge 128. Consequently, when the servo motor 138 is driven, the bridge 128 moves up and down through the ball screw 132, thereby causing the top ring shaft 111 and the top ring 1 to move up and down.

Additionally, the top ring shaft 111 is coupled to a rotating cylinder 112 through a key (not illustrated). The rotating cylinder 112 is provided with a timing pulley 113 on an outer periphery thereof. A top ring motor 114 is secured to the top ring head 110, and the timing pulley 113 is connected to a timing pulley 116 provided in the top ring motor 114 through a timing belt 115. Consequently, by rotationally driving the top ring motor 114, the rotating cylinder 112 and the top ring shaft 111 rotate as one through the timing pulley 116, the timing belt 115, and the timing pulley 113, and the top ring 1 rotates. Note that the top ring head 110 is supported by a top ring head shaft 117 rotationally supported by a frame (not illustrated).

In the polishing apparatus configured as illustrated in FIG. 1, the top ring 1 is capable of holding a substrate such as the semiconductor wafer WH on a bottom face thereof. The top ring head 110 is capable of turning about the top ring head shaft 117, and the turning of the top ring head 110 causes the top ring 1 holding the semiconductor wafer WH on the bottom face to move from a semiconductor wafer WH receiving position to above the polishing table 100. Thereafter, the top ring 1 is lowered to press the semiconductor wafer WH against the surface (polishing surface) 101a of the polishing pad 101. At this time, the top ring 1 and the polishing table 100 are each made to rotate, and the polishing liquid Q is supplied onto the polishing pad 101 from the polishing liquid supply nozzle 102 provided above the polishing table 100. In this way, a surface of the semiconductor wafer WH is polished by causing the semiconductor wafer WH to slide against the polishing surface 101a of the polishing pad 101.

Figure 2:
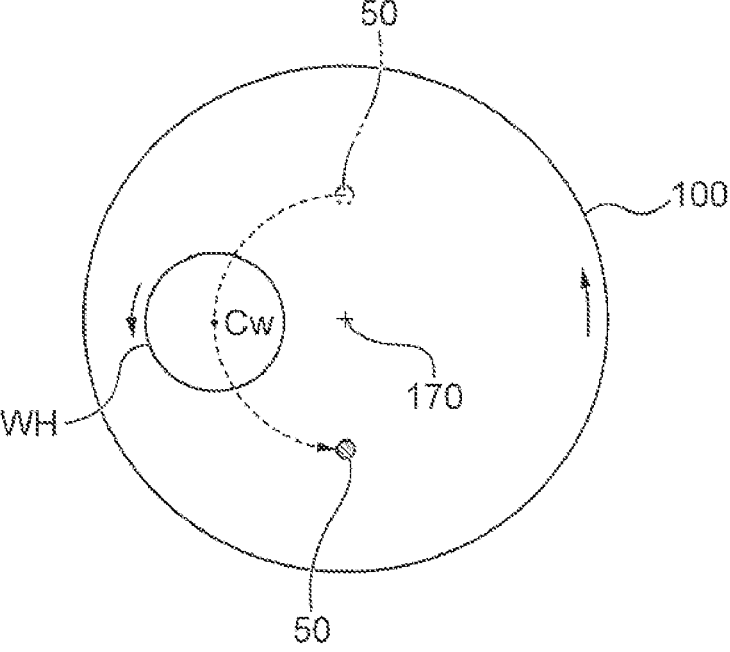
FIG. 2 is a plan view illustrating a relationship among a polishing table, an eddy current sensor, and a semiconductor wafer.

FIG. 2 is a plan view illustrating a relationship among the polishing table 100, the eddy current sensor 50, and the semiconductor wafer WH. As illustrated in FIG. 2, the eddy current sensor 50 is installed at a position that passes through a center Cw of the semiconductor wafer WH being polished that is held by the top ring 1. The polishing table 100 rotates about a rotation center 170. For example, the eddy current sensor 50 is configured to detect a metal film (conductive film) such as a Cu layer of the semiconductor wafer WH continuously on a passage trajectory (scan line) while passing under the semiconductor wafer WH.

Figure 3A:
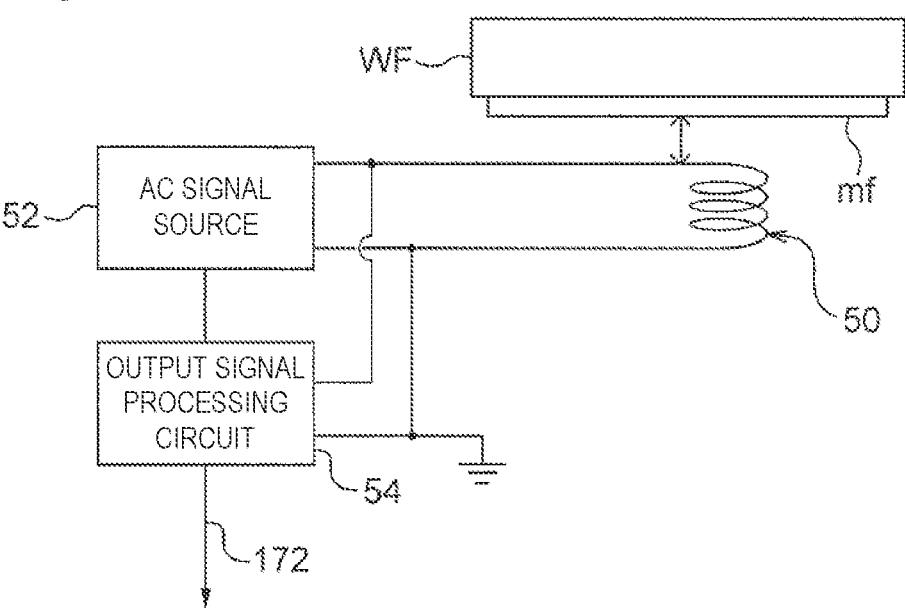
Figure 3B:
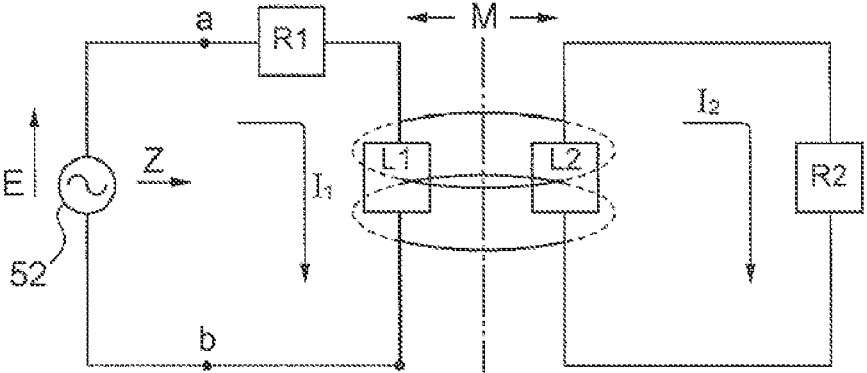

Next, the eddy current sensor 50 provided in the polishing apparatus according to the present invention will be described in further detail using the attached drawings. FIGS. 3A and 3B are diagrams illustrating a configuration of an eddy current sensor assembly including the eddy current sensor 50, in which FIG. 3A is a block diagram illustrating the configuration of the eddy current sensor assembly, and FIG. 3B is an equivalent circuit diagram of the eddy current sensor assembly. As illustrated in FIG. 3A, the eddy current sensor 50 is disposed near a metal film (or conductive film) mf to be detected, and an alternating-current (AC) signal source 52 is connected to an exciting coil of the eddy current sensor 50. Here, the metal film (or conductive film) mf to be detected is a thin film of a material such as Cu, Al, Au, or W formed on the semiconductor wafer WH, for example. The eddy current sensor 50 is disposed near the metal film (or conductive film) to be detected at a distance of approximately 1.0 mm to 4.0 mm for example. The coil is normally wound around a magnetic material such as ferrite (not illustrated).

Types of eddy current sensors include a frequency type that generates an eddy current in the metal film (or conductive film) mf to cause a change in an oscillating frequency and detects the metal film (or conductive film) from the frequency change, and an impedance type that generates an eddy current in the metal film (or conductive film) to cause a change in an impedance and detects the metal film (or conductive film) from the impedance change. In other words, with the frequency type, changing an eddy current $I_2$ causes an impedance Z to change in the equivalent circuit illustrated in FIG. 3B, and if the oscillating frequency of the signal source (a variable frequency oscillator) 52 changes, the change in the oscillating frequency can be detected by an output signal processing circuit 54, and a change in the metal film (or conductive film) can be detected. With the frequency type, the sensor may simply be an exciting coil only, and a detecting coil is unnecessary. Accordingly, the first exciting coil and the first detecting coil are the same coil, or the second exciting coil and the second detecting coil are the same coil.

With the impedance type, changing the eddy current $I_2$ causes the impedance Z to change in the equivalent circuit illustrated in FIG. 3B, and if the impedance Z as seen from the signal source (a fixed frequency oscillator) 52 changes, the change in the impedance Z can be detected by the output signal processing circuit 54, and a change in the metal film (or conductive film) can be detected.

In an eddy current sensor of the impedance type, it is possible to extract signal outputs X and Y, a phase, and the combined impedance Z (=X+iY). From impedance components X, Y, and the like, measurement information about a thickness of the metal film (or conductive film) of Cu, Al, Au, or W is obtained. As illustrated in FIG. 1, the eddy current sensor 50 can be built into the polishing table 100 at a position near the surface and positioned to face the semiconductor wafer to be polishing through the polishing pad, such that changes in the metal film (or conductive film) can be detected from an eddy current flowing through the metal film (or conductive film) on the semiconductor wafer.

For the frequency of the eddy current sensor, a single radio wave, AM-modulated radio waves, a sweep output from a function generator, or the like can be used, and it is preferable to select an oscillating frequency and a modulation method with good sensitivity to match the type of metal film.

Hereinafter, an eddy current sensor of the impedance type will be described specifically. The AC signal source 52 includes an oscillator (not illustrated) of a fixed frequency approximately from 2 MHz to 30 MHz. The oscillator is a quartz oscillator, for example. Additionally, a current $I_1$ flows through the eddy current sensor 50 due to an AC voltage supplied by the AC signal source 52. By causing a current to flow through the eddy current sensor 50 positioned near the metal film (or conductive film) mf, a magnetic flux links with the metal film (or conductive film) mf to form a mutual inductance M between the two, and an eddy current $I_2$ flows through the metal film (or conductive film) mf. Here, R1 is an equivalent resistance on a primary side that includes the eddy current sensor, and L1 is a self-inductance on the primary side that similarly includes the eddy current sensor. On a metal film (or conductive film) mf side, R2 is an equivalent resistance corresponding to eddy current loss, and L2 is a self-inductance thereof. The impedance Z seen on an eddy current sensor side from terminals a and b of the AC signal source 52 changes depending on a magnitude of the eddy current loss formed in the metal film (or conductive film) mf.

FIG. 1 also illustrates the output signal processing circuit 54 of the eddy current sensor 50. As illustrated in FIG. 2, the polishing table 100 of the polishing apparatus is capable of rotating about an axis 170, as indicated by an arrow. The AC signal source 52 and the output signal processing circuit 54 are embedded inside the polishing table 100. The eddy current sensor 50 may also be integrated with the AC signal source 52 and the output signal processing circuit 54. An output signal 172 from the output signal processing circuit 54 enters the table spindle 100a of the polishing table 100, passes through a rotary joint (not illustrated) provided on an axial end of the table spindle 100a, and is output to an endpoint detection controller 246 (endpoint detector). Note that at least one of the AC signal source 52 and the output signal processing circuit 54 may also be disposed outside the polishing table 100. The endpoint detection controller 246 is configured to detect, from the detected eddy current, a polishing endpoint that indicates the end of polishing of the polishing target.

Figure 4:
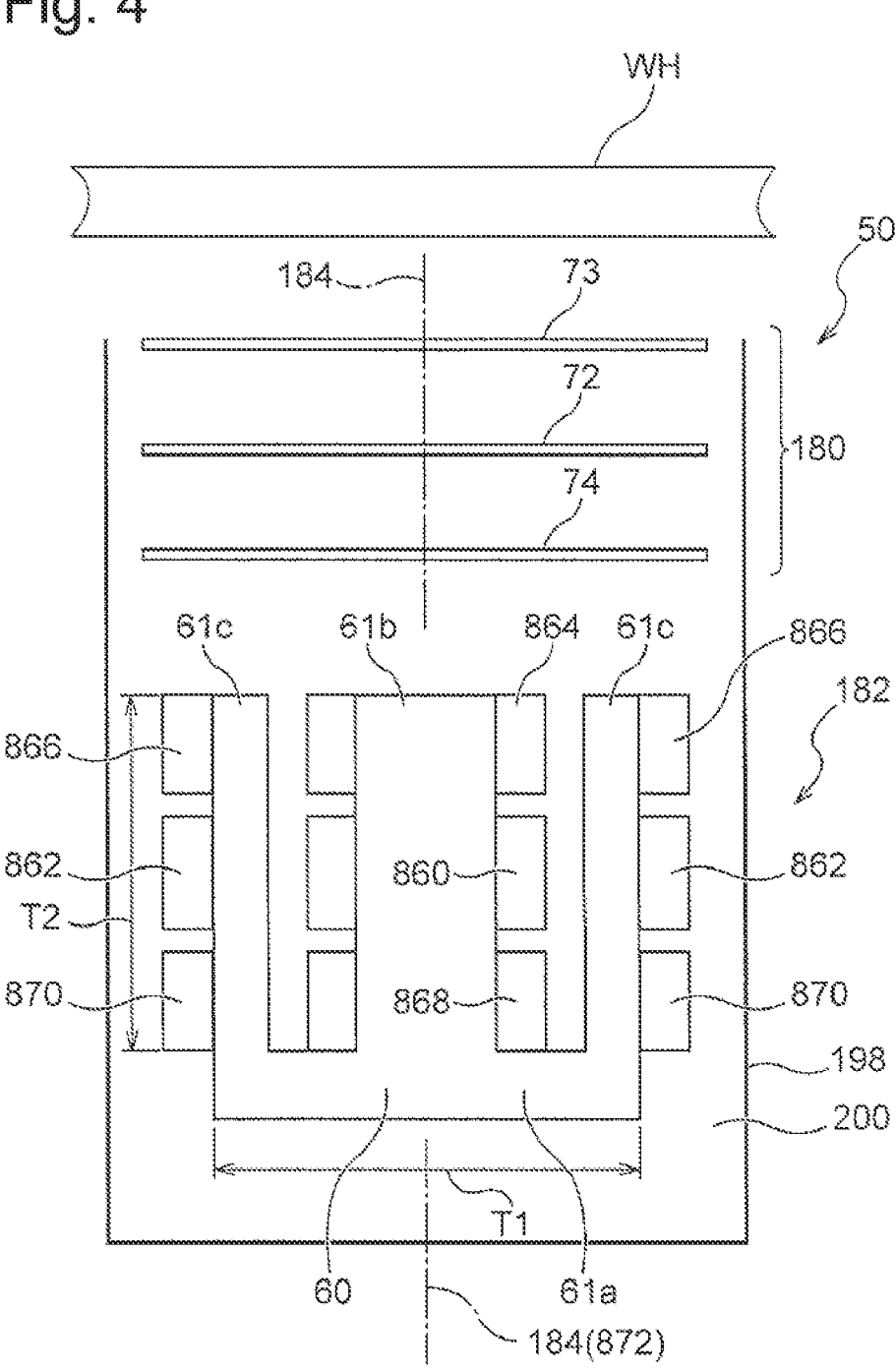
FIG. 4 is a schematic diagram illustrating an exemplary configuration of the eddy current sensor of the present embodiment.

FIG. 4 is a schematic diagram illustrating an exemplary configuration of the eddy current sensor 50 of the present embodiment. The eddy current sensor 50, which is disposed near a substrate on which a conductive film has been formed (the detection target, which is the semiconductor wafer WH, for example), includes a first detector 180 that detects an eddy current generated in the substrate and a second detector 182 that detects the eddy current. The first detector 180 includes a first exciting coil 72 configured to generate the eddy current, a first detecting coil 73 configured to detect the eddy current, and a first dummy coil 74.

The first exciting coil 72, the first detecting coil 73, and the first dummy coil 74 are air-core coils. The first exciting coil 72, the first detecting coil 73, and the first dummy coil 74 may also be coils with a core of a nonmagnetic material. The first exciting coil 72, the first detecting coil 73, and the first dummy coil 74 are obtained by forming a conductor in a helical shape on a thin resin substrate. In the drawing, the substrate is not illustrated.

The second detector 182 includes second exciting coils 860 and 862 configured to generate an eddy current, second detecting coils 864 and 866 configured to detect an eddy current, and second dummy coils 868 and 870. The second exciting coils 860 and 862, the second detecting coils 864 and 866, and the second dummy coils 868 and 870 are coils with a magnetic pot core 60.

In the present embodiment, the first exciting coil and the first detecting coil are air-core coils or coils with a core of a nonmagnetic material, while the second exciting coil and the second detecting coil are coils with a core of a magnetic material. Thus, when detecting fine metal, a detection output of the second detector is large, making it possible to provide an eddy current sensor with a large detection output even when detecting fine metal. In some cases, the second detector having a core of a magnetic material may have a smaller detection output than that of the first detector with respect to metal such as bulk, which is not fine metal. According to the present embodiment, it is possible to provide an eddy current sensor with a large detection output from the first detector at such times.

The first detector 180 is disposed between the semiconductor wafer WH and the second detector 182. Note that the first detector 180 may also be disposed peripherally around the second detector 182. In this case, it is preferable to provide a hole in the center of the first exciting coil 72, the first detecting coil 73, and the first dummy coil 74, and dispose the second detector 182 in the hole portion. In the drawing, the central axis 184 of the first exciting coil 72, the central axis 184 of the first detecting coil 73, the central axes 184 of the second exciting coils 860 and 862, and the central axes 184 of the second detecting coils 864 and 866 are aligned.

It is preferable to disposed the coils so that the central axis 184 of the first exciting coil 72, the central axis 184 of the first detecting coil 73, the central axes 184 of the second exciting coils 860 and 862, and the central axes 184 of the second detecting coils 864 and 866 are aligned. The reason why is that when the central axes 184 are aligned, the first detector 180 and the second detector 182 measure the film thickness at the same point on the semiconductor wafer WH, which makes control of polishing accurate and easy. When the central axes 184 are not aligned, that is, when the first detector 180 and the second detector 182 are disposed at different points inside the polishing table 100, it is necessary to consider that the film thickness of the semiconductor wafer WH varies depending on the location. The central axes 184 are not required to be aligned perfectly. A degree of alignment of the central axes 184 can be determined with consideration for the accuracy of film thickness measurement and the like.

In the drawing, the first detector 180 and the second detector 182 are disposed near each other, but the first detector 180 and the second detector 182 may also be disposed at distant positions. For example, the first detector 180 and the second detector 182 may be disposed at symmetric positions with respect to the rotation center 170 on the polishing table 100.

The first exciting coil 72, the first detecting coil 73, and the first dummy coil 74 in the drawing are coils obtained by winding a conductor in a single column with multiple layers, a column being defined as a direction perpendicular to the semiconductor wafer WH, a layer being defined as a direction parallel to the semiconductor wafer WH. Note that the first exciting coil 72, the first detecting coil 73, and the first dummy coil 74 may also be coils obtained by winding a conductor in multiple columns with multiple layers, in a single column with a single layer, or in multiple columns with a single layer. Among these, coils obtained by winding a conductor in a single column with multiple layers are preferable. This is because thin (that is, flat) coils without a magnetic core are capable of detection over a wide range. Note that the second exciting coils 860 and 862, the second detecting coils 864 and 866, and the second dummy coils 868 and 870 are coils obtained by winding a conductor in multiple columns with multiple layers.

The pot core 60 is a magnetic material and has a floor part 61a (bottom magnetic material), a magnetic core part 61b (central magnetic material) provided in the center of the floor part 61a, and a surrounding wall part 61c (peripheral magnetic material) provided on a periphery of the floor part 61a. The surrounding wall part 61c is a wall provided on the periphery of the floor part 61a so as to surround the magnetic core part 61b. In the present embodiment, the floor part 61a has a circular disc shape, the magnetic core part 61b has a solid circular columnar shape, and the surrounding wall part 61c has a cylindrical shape surrounding the floor part 61a. The second exciting coil includes a second central exciting coil 860 disposed at the magnetic core part 61b, and the second detecting coil includes a second central detecting coil 864 disposed at the magnetic core part 61b. The second dummy coil includes a second central dummy coil 868 disposed at the magnetic core part 61b.

The second exciting coil includes a second peripheral exciting coil 862 disposed at the surrounding wall part 61c. The second detecting coil includes a second peripheral detecting coil 866 disposed at the surrounding wall part 61c. The second detecting coil includes a second peripheral dummy coil 870 disposed at the surrounding wall part 61c. Note that the second peripheral exciting coil 862, the second peripheral detecting coil 866, and the second peripheral dummy coil 870 disposed at the surrounding wall part 61c may also be absent. In this case, the second detector 182 is a conventional coil with a pot-type core. Furthermore, the second detector 182 may include only the second peripheral exciting coil 862, the second peripheral detecting coil 866, and the second peripheral dummy coil 870 disposed at the surrounding wall part 61c, while the second central detecting coil 864, the second central exciting coil 860, and the second central dummy coil 868 disposed at the magnetic core part 61b may be absent.

The second detector 182 illustrated in the drawing will be described further. Of the six coils 860, 862, 864, 866, 868, and 870, the coils 860 and 862 in the center are exciting coils connected to the AC signal source 52. The exciting coils 860 and 862 form an eddy current in the metal film (or conductive film) mf on the semiconductor wafer WH disposed nearby due to a magnetic field formed by the voltage supplied by the AC signal source 52. The detecting coils 864 and 866 are disposed on the metal film side of the exciting coils 860 and 862, and detect the magnetic field generated by the eddy current formed in the metal film. The dummy coils 868 and 870 are disposed on the opposite side from the detecting coils 864 and 866 with the exciting coils 860 and 862 in between.

The exciting coil 860 is an inner coil disposed peripherally around the magnetic core part 61b, is configured to generate a magnetic field, and forms an eddy current in a conductive film. The exciting coil 862 is an outer coil disposed peripherally around the surrounding wall part 61c, is configured to generate a magnetic field, and forms an eddy current in a conductive film. The detecting coil 864 is disposed peripherally around the magnetic core part 61b, is configured to detect a magnetic field, and detects an eddy current formed in a conductive film. The detecting coil 866 is disposed peripherally around the surrounding wall part 61c, is configured to detect a magnetic field, and detects an eddy current formed in a conductive film.

The eddy current sensor includes the dummy coils 868 and 870 that detect an eddy current formed in a conductive film. The dummy coil 868 is disposed peripherally around the magnetic core part 61b, and is configured to detect a magnetic field. The dummy coil 870 is disposed peripherally around the surrounding wall part 61c, and is configured to detect a magnetic field. In the present embodiment, the detecting coils and the dummy coils are disposed peripherally around the floor part 61a and peripherally around the surrounding wall part 61c, but the detecting coils and the dummy coils may also be disposed on only one of either peripherally around the floor part 61a or peripherally around the surrounding wall part 61c.

An axial direction of the magnetic core part 61b is orthogonal to the conductive film on the substrate, the detecting coils 864 and 866, the exciting coils 860 and 862, and the dummy coils 868 and 870 are disposed at different positions in the axial direction of the magnetic core part 61b, and additionally, the detecting coils 864 and 866, the exciting coils 860 and 862, and the dummy coils 868 and 870 are disposed in the above order in the axial direction of the magnetic core part 61b proceeding from a position close to the conductive film on the substrate to a position farther away. A lead line (not illustrated) for connecting to the outside extends from each of the detecting coils 864 and 866, the exciting coils 860 and 862, and the dummy coils 868 and 870.

FIG. 4 is a cross section of the eddy current sensor 50 in a plane passing through a central axis 872 of the magnetic core part 61b. The pot core 60 is a magnetic material and has a circular floor part 61a, a circular columnar magnetic core part 61b provided in the center of the floor part 61a, and a cylindrical surrounding wall part 61c provided on the circumference of the floor part 61a. As one example of the dimensions of the pot core 60, a diameter T1 of the floor part 61a is approximately from 1 cm to 5 cm, and a height T2 of the pot core 60 is approximately from 1 cm to 5 cm. An outer diameter of the surrounding wall part 61c has the same cylindrical shape in a height direction in FIG. 4, but the outer diameter may also have a converging shape (tapered shape)

that narrows in a direction going away from the floor part 61*a*, or in other words, narrows toward a tip. Also, the magnetic core is not limited to a circular shape, and may also be elliptical or rectangular. The magnetic core likewise is not limited to a circular column, and may also be an elliptical column or a rectangular column.

The conducting wire used in the detecting coils 864 and 866, the exciting coils 860 and 862, and the dummy coils 868 and 870 is copper, Manganin wire, or nichrome wire. As a result of using Manganin wire or nichrome wire, there are fewer temperature changes due to electrical resistance and the like, and the temperature properties are improved.

In the present embodiment, wire rod is wrapped around the outside of the magnetic core part 61*b* and the outside of the surrounding wall part 61*c* made of ferrite or the like to form the exciting coils 860 and 862, and therefore the eddy current density flowing through the measurement target can be raised. Additionally, because the detecting coils 864 and 866 are also formed on the outside of the magnetic core part 61*b* and the outside of the surrounding wall part 61*c*, the generated reverse magnetic field (interlinkage flux) can be collected efficiently.

Figure 5:
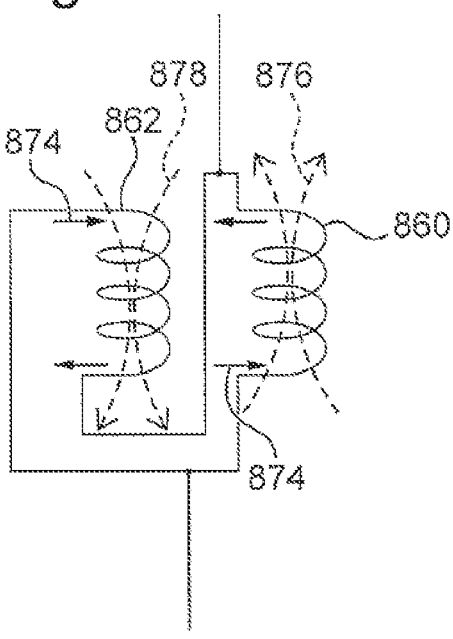
FIG. 5 is a schematic diagram illustrating an exemplary connection of exciting coils in a second detector.

To raise the eddy current density flowing through the measurement target, in the present embodiment, the exciting coil 860 and the exciting coil 862 are additionally connected in parallel, as illustrated in FIG. 5. FIG. 5 is a schematic diagram illustrating an exemplary connection of exciting coils in the second detector 182. In other words, the inner coil and the outer coil are electrically connected in parallel. The reasons for connecting in parallel are as follows. When connected in parallel, the voltage that can be applied to the exciting coil 860 and the exciting coil 862 is increased and the current flowing through the exciting coil 860 and the exciting coil 862 is increased over the case of connecting in series. Consequently, the magnetic field is larger. Also, when connected in series, the inductance of the circuit increases, and the frequency of the circuit falls. This makes it difficult to apply the necessary high frequency to the exciting coils 860 and 862. An arrow 874 indicates a direction of current flowing through the exciting coil 860 and the exciting coil 862.

Figure 6:
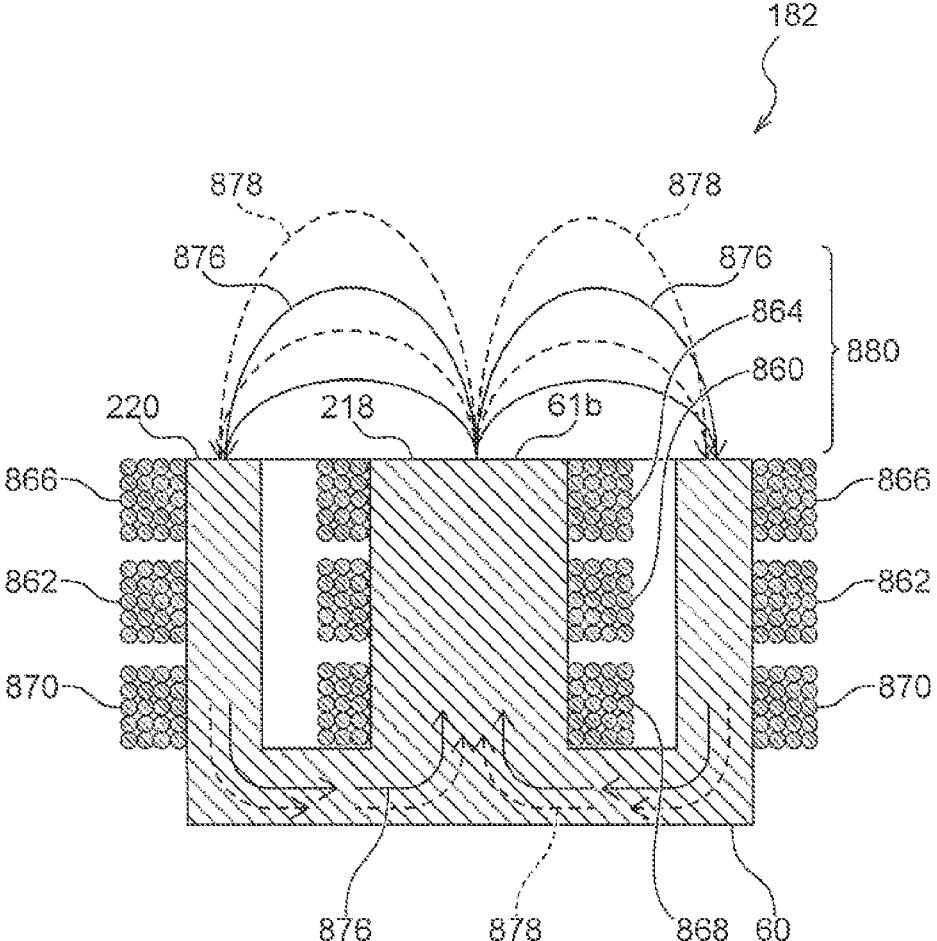
FIG. 6 is a diagram illustrating a magnetic field by the second detector.

As illustrated in FIG. 5, the exciting coil 860 and the exciting coil 862 are connected such that the exciting coil 860 and the exciting coil 862 have the same magnetic field direction. In other words, current flows in different directions in the exciting coil 860 and the exciting coil 862. A magnetic field 876 is a magnetic field generated by the exciting coil 860 on the inner side, while a magnetic field 878 is a magnetic field generated by the exciting coil 862 on the outer side. As illustrated in FIG. 6, the magnetic field directions of the exciting coil 860 and the exciting coil 862 are the same. FIG. 6 is a diagram illustrating a magnetic field by the second detector 182. In other words, the direction of the magnetic field that the inner coil (second central exciting coil 860) generates inside the magnetic core part 61*b* is the same as the direction of the magnetic field that the outer coil (second peripheral exciting coil 862) generates inside the magnetic core part 61*b*.

Because the magnetic field 876 and the magnetic field 878 illustrated in a region 880 that is an upper part of the second detector 182 have the same orientation, the two magnetic fields are added together and become larger. Compared to the case where only the magnetic field 876 generated by the exciting coil 860 exists like in the related art, in the present embodiment, the magnetic field is larger by the extent of the magnetic field 878 generated by the exciting coil 862. FIG.

Figures 7A, 7B:
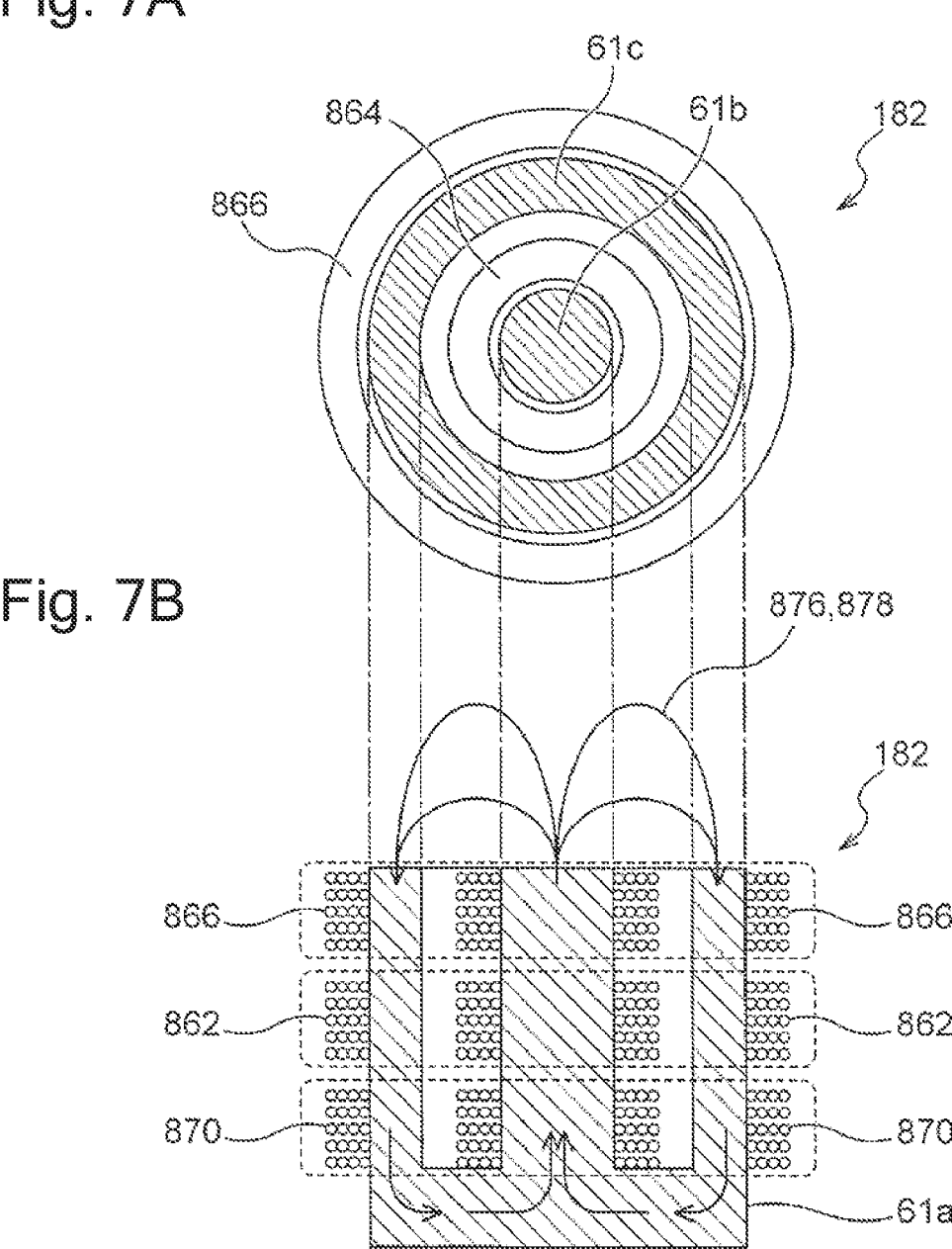
FIG. 7A is a plan view of the second detector and FIG. 7B is a cross section of the second detector.

7A illustrates a plan view of the second detector 182. FIG. 7B is a cross section of the second detector 182 in FIG. 4.

Figure 8:
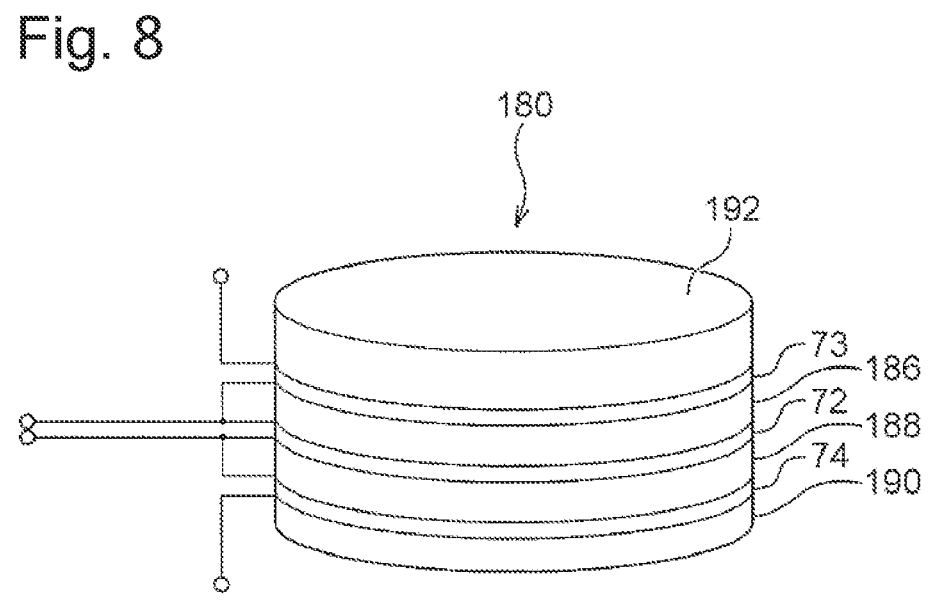

FIG. 8 is a schematic diagram illustrating an exemplary configuration of the first detector 180 in the eddy current sensor 50 of the present embodiment. As illustrated in the drawing, the first detector 180 includes the first exciting coil 72 for forming an eddy current in the metal film (or conductive film) on the semiconductor wafer WH, and the first detecting coil 73 for detecting the eddy current of the metal film (or conductive film). The first dummy coil 74 is disposed on the side of the first exciting coil 72 opposite the first detecting coil 73. The first detecting coil 73, the first exciting coil 72, and the first dummy coil 74 are formed on substrates 186, 188, and 190, respectively. A resin protective layer 192 is provided on top of the first detecting coil 73. The protective layer 192 may also be absent. The first detecting coil 73, the first exciting coil 72, and the first dummy coil 74 may also be ordinary solenoid coils wound around a resin bobbin.

The first exciting coil 72 in the drawing is an oscillating coil connected to the signal source 52. The oscillating coil 72 forms an eddy current in the metal film (or conductive film) mf on the semiconductor wafer WH located nearby due to a magnetic field formed by the voltage supplied by the AC signal source 52. The first detecting coil 73 is disposed on the upper side (the metal film (or conductive film) side) of the first exciting coil 72, and detects the magnetic field generated by the eddy current formed in the metal film (or conductive film).

FIGS. 9A to 9C are schematic diagrams illustrating an exemplary connection of each coil in the first detector 180 of the eddy current sensor 50. In this example, a resistance bridge circuit 77 is used. As illustrated in FIG. 9A, the detecting coil 73 and the dummy coil 74 are connected in reverse phase with each other. The detecting coil 73 and the dummy coil 74 form a reverse-phase series circuit, both ends of which are connected to the resistance bridge circuit 77 including a variable resistance 76.

Specifically, a signal line 731 of the detecting coil 73 is connected to a terminal 773 of the resistance bridge circuit 77, and a signal line 732 of the detecting coil 73 is connected to a terminal 771 of the resistance bridge circuit 77. A signal line 741 of the dummy coil 74 is connected to a terminal 772 of the resistance bridge circuit 77, and a signal line 742 of the dummy coil 74 is connected to the terminal 771 of the resistance bridge circuit 77. The terminal 771 is grounded. A terminal 774 of the resistance bridge circuit 77 is a sensor output. The detecting coil 73, the exciting coil 72, and the dummy coil 74 have inductances $L_1$, $L_2$, and $L_3$, respectively.

By connecting the exciting coil 72 to the AC signal source 52 and generating alternating flux, an eddy current is formed in the metal film (or conductive film) mf located nearby. By adjusting a resistance value of the variable resistance 76, the output voltage of the series circuit containing the detecting coil 73 and the dummy coil 74 is adjustable so as to be zero when a metal film (or conductive film) is not present. $L_1$ and $L_3$ signals are adjusted to be in the same phase with each other by the variable resistance 76 ($VR_1$ and $VR_2$) inserted in parallel with each of the detecting coil 73 and the dummy coil 74. In other words, in the equivalent circuit in FIG. 9B, variable resistances $VR_1 (=VR_{1\text{-}1} + VR_{1\text{-}2})$ and $VR_2 (=VR_{2\text{-}1} + VR_{2\text{-}2})$ are adjusted such that $$VR_{1\text{-}1} \times (VR_{2\text{-}2} + j\omega L_3) = VR_{1\text{-}2} \times (VR_{2\text{-}1} + j\omega L_1) \qquad (1)$$

With this arrangement, as illustrated in FIG. 9C, the $L_1$ and $L_3$ signals before adjustment (indicated by the dashed lines in the diagram) are set to signals having the same phase and the same amplitude (indicated by the solid line in the diagram).

Figure 10:
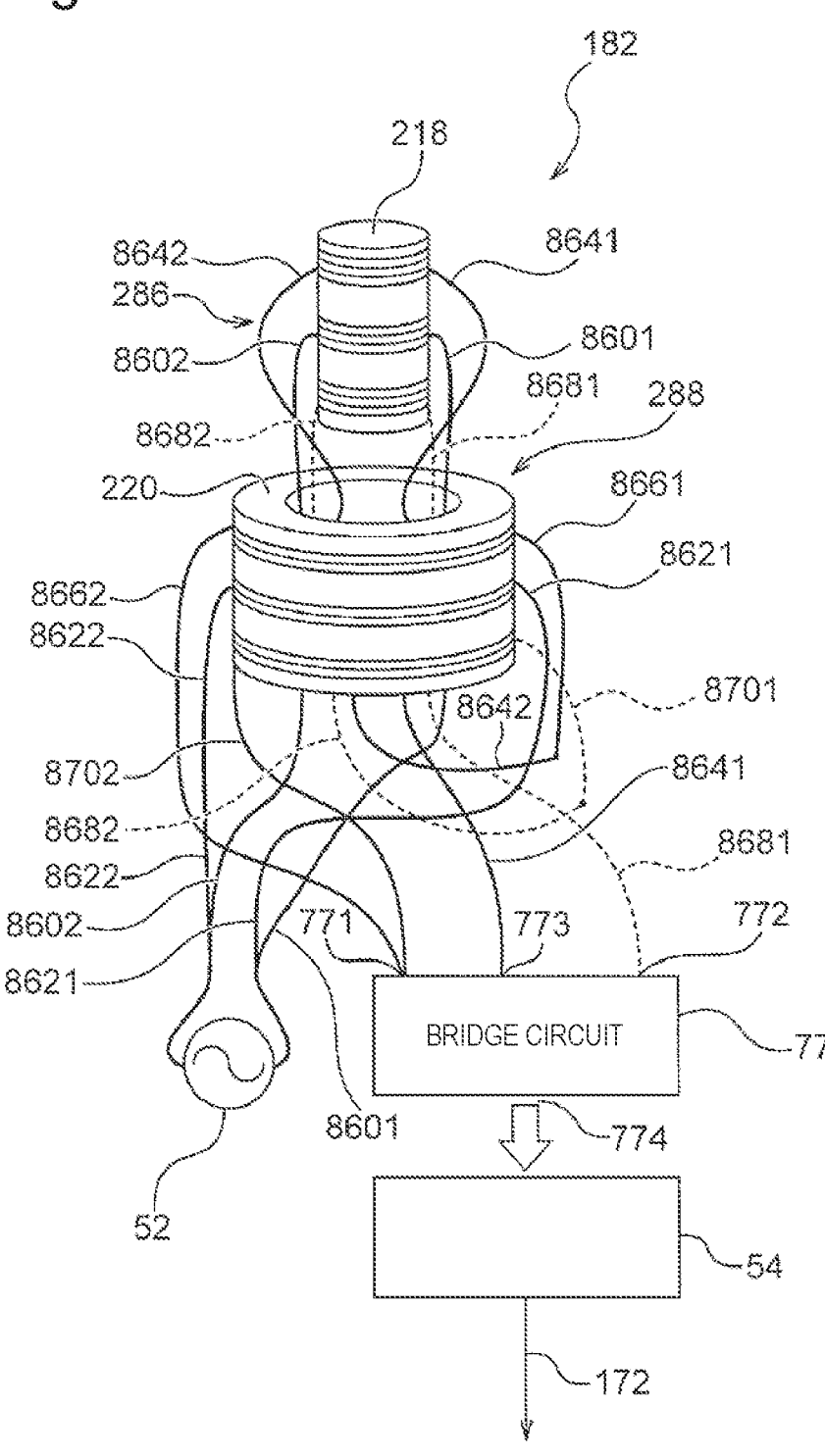
FIG. 10 is a schematic diagram illustrating an exemplary connection of each coil in the second detector of the eddy current sensor.
Figure 14:
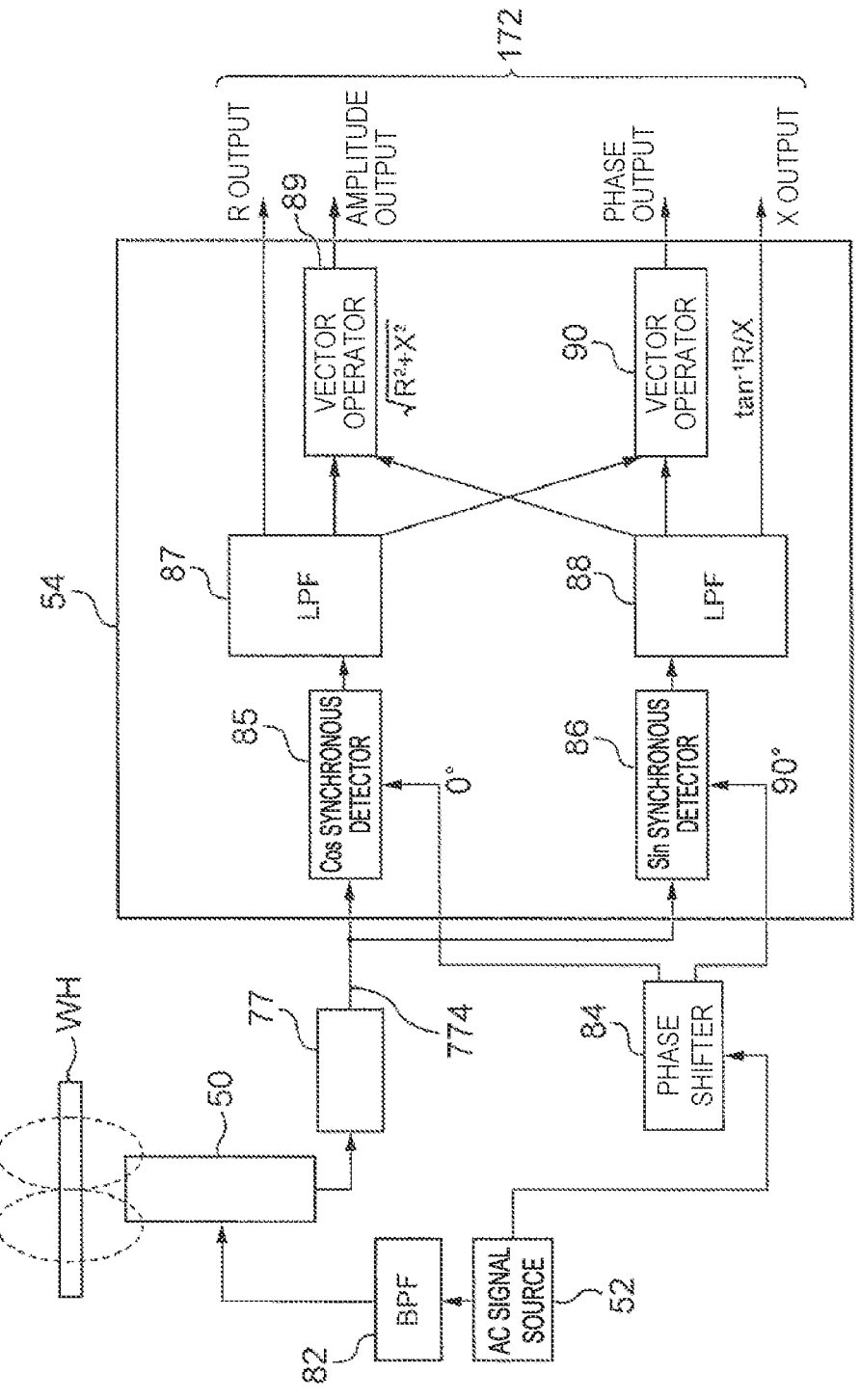
FIG. 14 is a block diagram illustrating an output signal processing circuit of the eddy current sensor.

FIG. 10 is a schematic diagram illustrating an exemplary connection of each coil in the second detector 182 of the eddy current sensor 50. An example of the output signal processing circuit 54 corresponding to the eddy current sensor of FIG. 10 is illustrated in FIG. 14. FIG. 10 illustrates a perspective view of the second detector 182 illustrated in FIG. 4. In FIG. 10, a top face 218 is illustrated above a top face 220 for easier understanding, but the top face 218 and the top face 220 are in a same horizontal plane as illustrated in FIG. 6. In FIG. 10, there are two coil assemblies, but there may also be three or more coil assemblies. In the case where there are two or more coil assemblies, the measurement accuracy (S/N ratio) is improved because of the increased number of film thickness measurements compared to the case of a single coil assembly.

In the second detector 182, a detecting coil 864 of an inner eddy current sensor 286 and a detecting coil 866 of an outer eddy current sensor 288 are connected in series. A dummy coil 868 of the inner eddy current sensor 286 and a dummy coil 870 of the outer eddy current sensor 288 are connected in series. The exciting coil 860 and the exciting coil 862 of the inner and outer eddy current sensors are connected in parallel to the signal source 52. Note that the detecting coil 864 and the detecting coil 866 may also be connected in parallel, and the dummy coil 868 and the dummy coil 870 may also be connected in parallel.

In FIG. 10, one bridge circuit 77 is used, but two bridge circuits 77 may also be used. In other words, the detecting coil 864 and the detecting coil 866 may be respectively connected to two bridge circuits 77 independently, and the dummy coil 868 and the dummy coil 870 may be respectively connected to the two bridge circuits 77 independently. From the perspective of frequency characteristics, independent connections to separate bridge circuits 77 are preferable. Note that a bridge circuit may also not be used. In other words, it is also possible for the output of the eddy current sensor 50 to be input directly into the output signal processing circuit 54 and processed, without going through a bridge circuit. When not using a bridge circuit, the dummy coils 74, 868, and 870 are unnecessary.

The specific connections in FIG. 10 are as follows. In the inner eddy current sensor 286, the detecting coil 864 includes signal lines 8641 and 8642. The exciting coil 860 includes signal lines 8601 and 8602. The dummy coil 868 includes signal lines 8681 and 8682. In the outer eddy current sensor 288, the detecting coil 866 includes signal lines 8661 and 8662. The exciting coil 862 includes signal lines 8621 and 8622. The dummy coil 870 includes signal lines 8701 and 8702.

The signal line 8641 of the detecting coil 864 of the inner eddy current sensor 286 is connected to the terminal 773 of the resistance bridge circuit 77. The signal line 8642 of the detecting coil 864 is connected to the signal line 8661 of the detecting coil 866 of the outer eddy current sensor 288. The signal line 8662 of the detecting coil 866 is connected to the terminal 771 of the resistance bridge circuit 77. The signal line 8681 of the dummy coil 868 of the inner eddy current sensor 286 is connected to the terminal 772 of the resistance bridge circuit 77. The signal line 8642 of the dummy coil 868 is connected to the signal line 8701 of the dummy coil 870 of the outer eddy current sensor 288. The signal line 8702 of the dummy coil 870 is connected to the terminal 771 of the resistance bridge circuit 77.

In the drawing, the output of detecting coil 864 of the inner eddy current sensor 286 and the output of the detecting coil 866 of the outer eddy current sensor 288 are in series, and consequently there is an effect of increased output compared to the case of a single detecting coil. The terminal 774 of the bridge circuit 77 is connected to the output signal processing circuit 54 (detector circuit). The output of the output signal processing circuit 54 is the output signal 172, and is connected to the endpoint detection controller 246 illustrated in FIG. 1.

Figure 11:
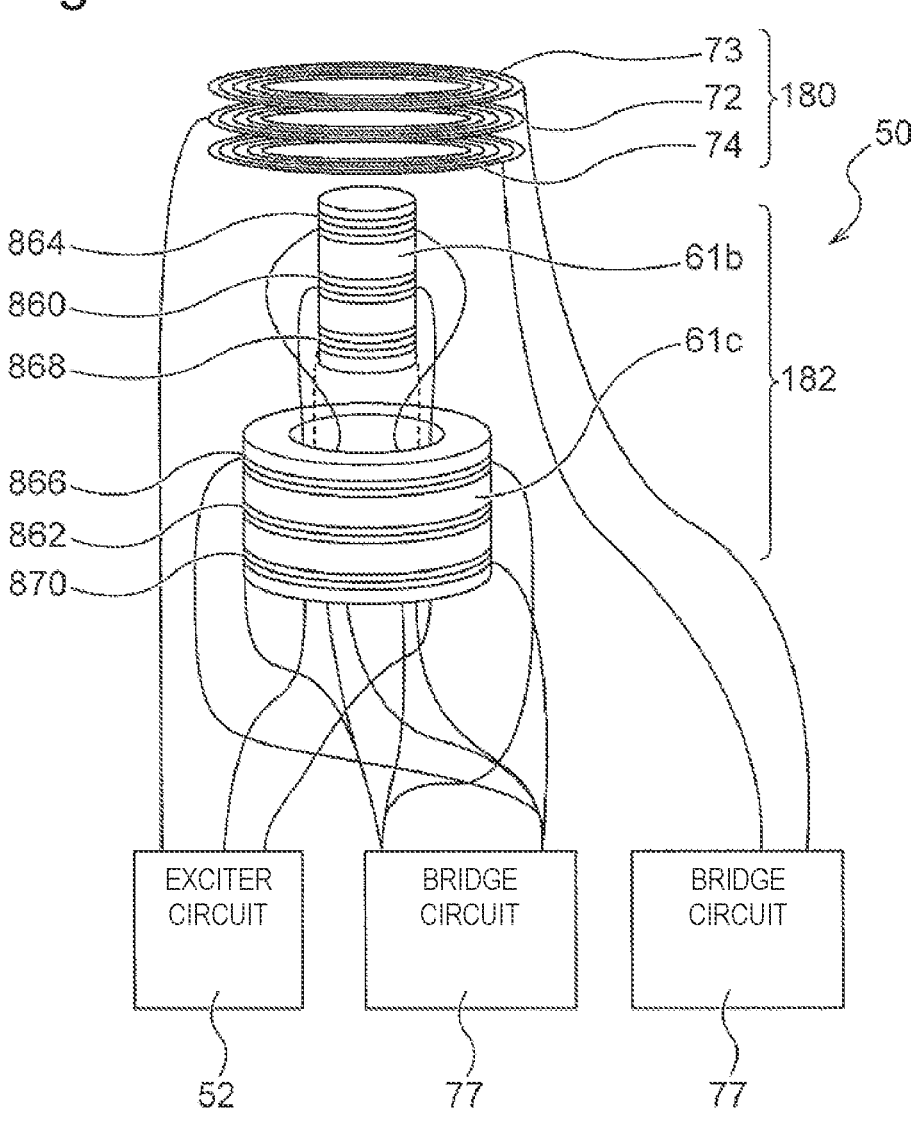
FIG. 11 is a diagram illustrating connections between the entire eddy current sensor and bridge circuits.

FIG. 11 illustrates connections between the entire eddy current sensor 50 and the bridge circuits 77. This drawing summarizes the exemplary connections described using FIGS. 8 to 10. Connections between the eddy current sensor 50 and the bridge circuits 77 are simplified to avoid complexity. As described above, the eddy current sensor 50 includes different types of coils. Namely, the first exciting coil and the first detecting coil are air-core coils or coils with a core of a nonmagnetic material, while the second exciting coil and the second detecting coil are coils with a core of a magnetic material. In the present embodiment, different types of coils are selected according to the application.

By combining a core coil (second detector 182) with a magnetic material such as ferrite with a coil (first detector 180) that is flatter than the core coil, the sensitivity, resolution, and spot diameter can be improved. In other words, the second detector 182 and the first detector 180 have different merits. The second detector 182 has the merits of a small range (referred to as the spot diameter) in which to detect an eddy current and high resolution for thin films. Here, resolution refers to a ratio of the change in the output of the eddy current sensor to the change in film thickness. On the other hand, the second detector 182 has low resolution for thick films compared to the first detector 180.

The reasons for the small spot diameter of the second detector 182 are as follows. The second detector 182, having a magnetic core, can form a magnetic field over a narrow range, and thus can detect magnetic flux efficiently over a narrow range. Accordingly, the spot diameter is reduced. In the case in which the first detector 180 is a flat coil or the like, the diameter needs to be greater than that of the second detector 182, which is a core coil, to obtain the same output as the core coil. Accordingly, to obtain a small spot diameter, the second detector 182 needs to be a core coil.

The first detector 180, being a flat coil or a solenoid coil, has the merits of good frequency characteristics and high resolution for thick films. Here, frequency characteristics refer to whether the resonance point of the coil (the frequency at which the coil resonates) is high or low. Good frequency characteristics mean that the coil has a high resonance point. If the coil has a high resonance point, a high frequency can be applied to the coil, thereby heightening the sensitivity of the sensor. On the other hand, when compared to the second detector 182, the first detector 180 is characterized by having low resolution for thin films and a large spot diameter.

Figure 12:
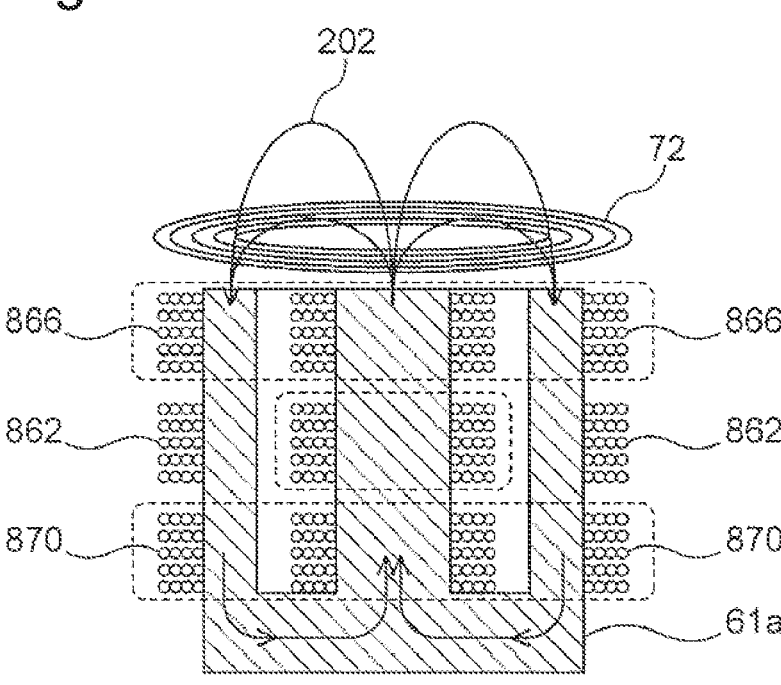
FIG. 12 is a diagram illustrating a magnetic field generated by the eddy current sensor.
Figure 13:
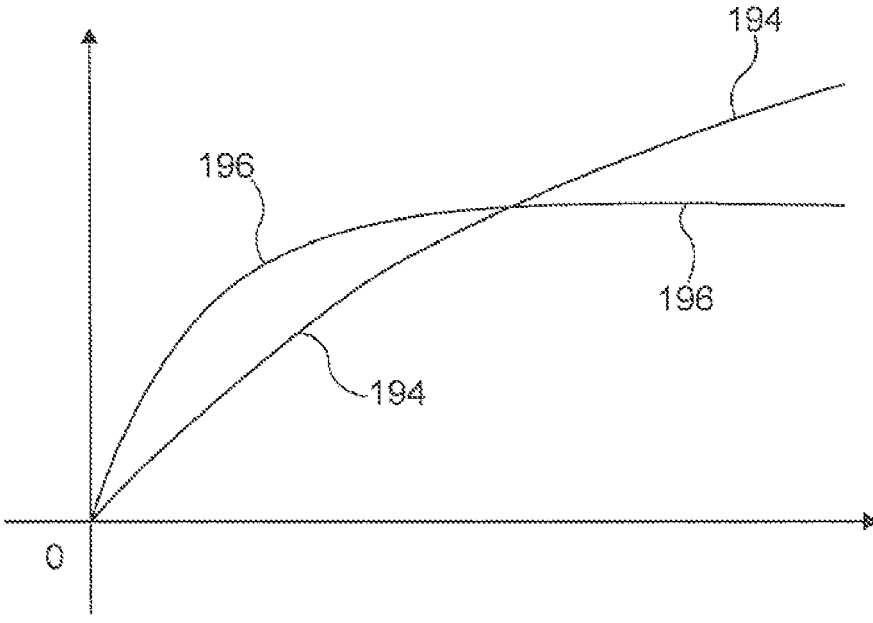
FIG. 13 illustrates an output of the first detector and an output of the second detector after processing in the bridge circuit.

FIG. 12 illustrates a magnetic field 202 generated by the eddy current sensor 50. FIG. 13 illustrates an output 194 of the first detector 180 and an output 196 of the second detector 182. The output 194 is a signal output by the terminal 774 of the bridge circuit 77 after the processing, by the bridge circuit 77, of the output of the first detecting coil 73 and the first dummy coil 74 of the first detector 180. The output 196 is a signal output by the terminal 774 after the processing, by the bridge circuit 77, of the output of the second detecting coils 864 and 866 and the second dummy coils 868 and 870 of the second detector 182. A horizontal axis of the diagram is the film thickness (in units of nanometers (nm)), and a vertical axis is the voltage (in units of millivolts (mV)).

As FIG. 13 demonstrates, when the film thickness is thin, the output 196 of the second detector 182 is larger than the output 194 of the first detector 180, and when the film thickness is thick, the output 196 of the second detector 182 is smaller than the output 194 of the first detector 180. In regard to a difference in resolution with respect to film thickness, the diagram also demonstrates that the second detector 182 has high resolution for thin films while the first detector 180 has high resolution for thick films.

The diagram indicates that the output of the sensor depends on the film thickness, but more precisely, the output of the sensor depends on the resistance value of the film. In other words, in the case of a metal with a high resistance value (for example, titanium or ruthenium), the output of the sensor will be small because the resistance value is high, even for a thick film. On the other hand, in the case of a metal with a low resistance value, such as gold, the output of the sensor will be large because the resistance value is low, even for a thin film. FIG. 13 illustrates measurement values for a metal with a relatively low resistance value, such as copper.

FIG. 14 is a block diagram illustrating the output signal processing circuit 54 (synchronous detector circuit) of the eddy current sensor 50. This diagram illustrates an example of a circuit for measuring an impedance Z seen on the eddy current sensor 50 side from the AC signal source 52 side. In the circuit for measuring the impedance Z illustrated in the diagram, a resistance component (R), a reactance component (X), an amplitude output (Z), and a phase output $(\tan^{-1} R/X)$ associated with changes in film thickness can be extracted. The diagram illustrates a processing circuit of the first detector 180 or the second detector 182. In other words, the diagram illustrates one of the two bridge circuits 77 in FIG. 11. The output signals of the two bridge circuits 77 are each processed by the similar output signal processing circuit 54.

As described above, the signal source 52, which supplies an AC signal to the eddy current sensor 50 disposed near the semiconductor wafer WH on which the metal film (or conductive film) mf to be detected is formed, is an oscillator of fixed frequency containing a crystal oscillator, and supplies a voltage at a fixed frequency of 2 MHz, 8 MHz, or 16 MHz, for example. The AC voltage formed by the signal source 52 is supplied to the eddy current sensor 50 through a bandpass filter 82. A signal detected at the terminal of the eddy current sensor 50 passes through the bridge circuit 77, and a cos component and a sin component of the detection signal are extracted by a synchronous detector containing a cos synchronous detector circuit 85 and a sin synchronous detector circuit 86. Here, the oscillation signal formed by the signal source 52 is used by a phase shift circuit 84 to form two signals of an in-phase component) (0°) and an orthogonal component (90°) of the signal source 52, which are introduced into the cos synchronous detector circuit 85 and the sin synchronous detector circuit 86 respectively to perform the synchronous detection described above.

In the synchronously detected signals, an unwanted high-frequency component above the signal component is removed by low-pass filters 87 and 88 to extract the resistance component (R) output as a cos synchronous detection output and the reactance component (X) output as a sin synchronous detection output, respectively. Additionally, the amplitude output $(R^2+X^2)^{1/2}$ is obtained from the resistance component (R) output and a reactance component (X) output by a vector operator circuit 89. Also, the phase output $(\tan^{-1}R/X)$ is obtained similarly from the resistance component output and the reactance component output by a vector operator circuit 90.

Figure 15:
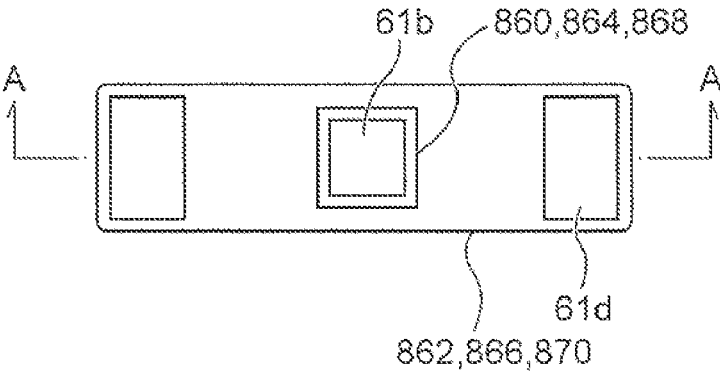
FIG. 15 illustrates an example in which a peripheral magnetic material is not a wall part provided on a periphery of a floor part to enclose a magnetic core part.
Figure 16:
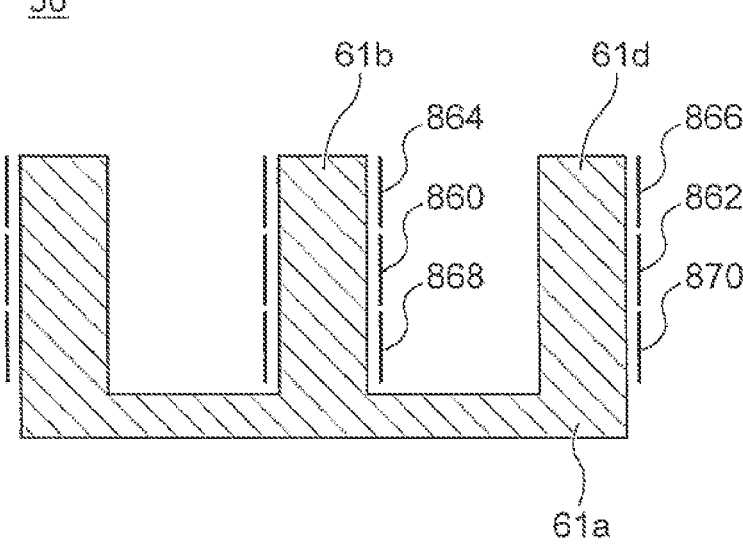
FIG. 16 illustrates an example in which the peripheral magnetic material is not the wall part provided on the periphery of the floor part to enclose the magnetic core part.
Figure 17:
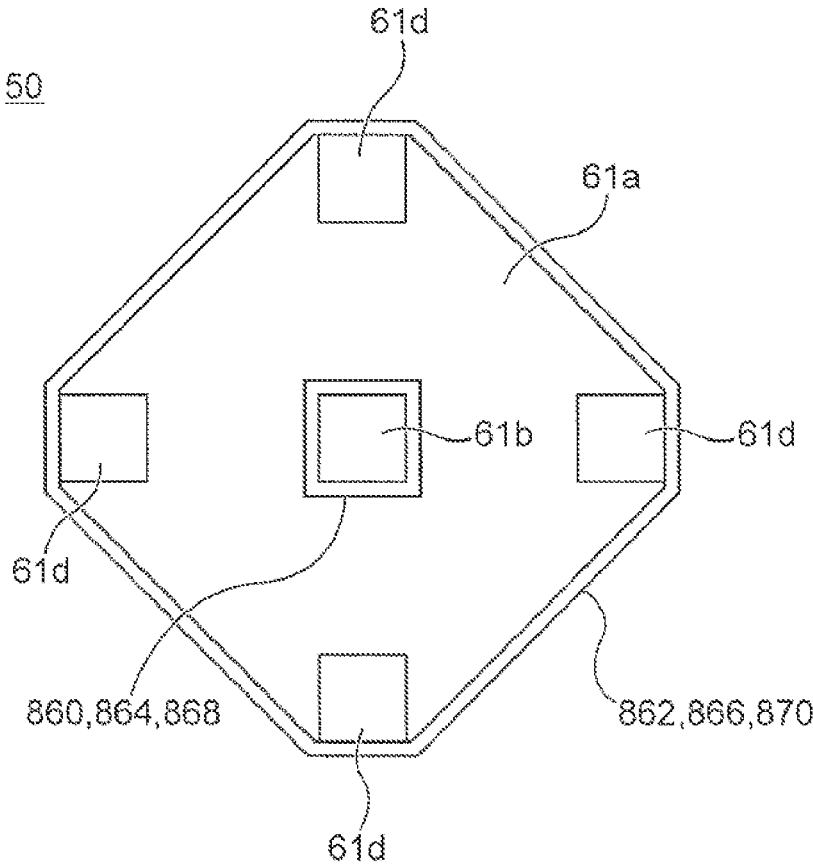
FIG. 17 illustrates an example in which the peripheral magnetic material is not the wall part provided on the periphery of the floor part to enclose the magnetic core part.

Next, FIGS. 15 to 17 will be used to describe an example in which the peripheral magnetic material is not the wall part 61*c* (see FIG. 7A) provided on the periphery of the floor part 61*a* to enclose the magnetic core part 61*b*. FIGS. 15 and 16 illustrate the eddy current sensor 50 in which the floor part 61*a* has a rod shape, and the wall part 61*c* is disposed at both ends of the rod shape. FIG. 15 is a top view. FIG. 16 is an AA cross section of FIG. 15. Two pieces of the peripheral magnetic material 61*d* are provided on the periphery of the floor part 61*a*. The eddy current sensor 50 has an E-shaped magnetic core, as seen from FIG. 16. FIG. 17 is a top view of an eddy current sensor 50 in which four pieces of the peripheral magnetic material 61*d* are provided on the periphery of the floor part 61*a*. The peripheral magnetic material 61*d* may also be five or more pieces. Note that in FIGS. 4, 15, and 17, the coil may also be on the outside only (in other words, only the wall part 61*c* or the peripheral magnetic material 61*d*) or on the inside only (in other words, only the magnetic core part 61*b*). In such cases, inside only is better. Note that providing the coil on both the outside and the inside is more preferable than providing the coil on only one of either the outside or the inside. The above describes the case in which the magnetic material of the second detector 182 is a pot-type core, E-type core, or the like, but the magnetic material of the second detector 182 may also be a bar core.

As illustrated in FIG. 4, the eddy current sensor 50 may have a housing 198. In this case, the first detector 180 and the second detector 182 are disposed inside the metal housing 198. The housing 198 can reduce the electrical influence that the eddy current sensor 50 is subjected to from the outside. The first detector 180 and the second detector 182 are secured inside the housing 198 by, for example, filling gaps in the housing 198, such as gaps between coils, with resin 200 such as epoxy resin.

A method of controlling each unit of the polishing apparatus on the basis of the film thickness obtained by the eddy current sensor 50 is described hereinafter. As illustrated in FIG. 1, the eddy current sensor 50 is connected to the endpoint detection controller 246 via the output signal processing circuit 54. The endpoint detection controller 246 is connected to an equipment controller 248. Consequently, the output signal from the eddy current sensor 50 is sent to the endpoint detection controller 246. The endpoint detection controller 246 performs necessary processing (arithmetic processing and correction) on the output signal 172 from the output signal processing circuit 54 to generate a monitoring signal (film thickness data). The equipment controller 248 controls components such as the top ring motor 114 and a motor for the polishing table 100 (not illustrated) on the basis of the film thickness data.

Next, the control of the polishing apparatus as a whole by the equipment controller 248 will be described. The equipment controller 248, which is a main controller, includes a CPU, a memory, a recording medium, and software or the like recorded to the recording medium. The equipment controller 248 performs monitoring and control of the polishing apparatus as a whole, exchanging signals, recording information, and performing computations for this purpose. The equipment controller 248 has a built-in program to function as control means for controlling polishing by the polishing apparatus. The endpoint detection controller 246 can also include a CPU, a memory, a recording medium, and software or the like recorded to the recording medium. The endpoint detection controller 246 has a built-in program to function as endpoint detecting means for detecting a polishing endpoint that indicates an end of polishing. Note that program may be partially or fully built into the equipment controller 248. The program is updatable. Note that the program does not have to be updatable.

Next, a method of detecting a film thickness using the eddy current sensor 50 will be described. In this method, when the electrical resistance of the semiconductor wafer WH (detection target) is determined to be less than a predetermined value, the equipment controller 248 detects an eddy current with the first detector 180 to obtain the film thickness (step 1). When the electrical resistance of the semiconductor wafer WH is determined to be greater than the predetermined value, the equipment controller 248 detects an eddy current with the second detector 182 to obtain the film thickness (step 2). The equipment controller 248 determines whether the electrical resistance of the semiconductor wafer WH is greater than the predetermined value according to the following method, for example. (1) The electrical resistance is determined to be less than the predetermined value until the polishing time has elapsed for a predetermined time, and/or (2) the electrical resistance is determined to be less than the predetermined value until the output of the first detector 180 falls to or below a predetermined value, and/or (3) the electrical resistance is determined to be less than the predetermined value until the output of the second detector 182 falls to or below a predetermined value, and/or (4) the electrical resistance is determined to be less than the predetermined value when the film thickness is less than a predetermined value on the basis of film thickness data generated by the endpoint detection controller 246.

Next, a different method of detecting a film thickness using the eddy current sensor 50 will be described. In this method, when the film thickness of the semiconductor wafer WH (detection target) is determined to be greater than a predetermined value, the equipment controller 248 detects an eddy current with the first detector 180 to obtain the film thickness (step 11). When the film thickness of the semiconductor wafer WH is determined to be less than a predetermined value, the equipment controller 248 detects an eddy current with the second detector 182 to obtain the film thickness (step 12). The equipment controller 248 determines whether the film thickness of the semiconductor wafer WH is greater than the predetermined value according to the following method, for example. (1) The film thickness is determined to be greater than the predetermined value until the polishing time has elapsed for a predetermined time, and/or (2) the film thickness is determined to be greater than the predetermined value until the output of the first detector 180 falls to or below a predetermined value, and/or (3) the film thickness is determined to be greater than the predetermined value until the output of the second detector 182 falls to or below a predetermined value, and/or (4) the film thickness is determined to be greater than the predetermined value on the basis of film thickness data generated by the endpoint detection controller 246.

The foregoing describes exemplary embodiments of the present invention, but the embodiments described above are for facilitating the understanding of the present invention, and do not limit the present invention. The present invention may be modified and improved without departing from the scope of the invention, and any equivalents obtained through such modification and improvement are obviously included in the present invention. Furthermore, any combination or omission of the components described in the claims and the specification is possible insofar as at least one or some of the problems described above can be addressed, or insofar as at least one or some of the effects are exhibited.

This application claims priority under the Paris Convention to Japanese Patent Application No. 2022-208003 filed on Dec. 26, 2022. The entire disclosure of Japanese Patent Laid-Open Nos. 2011-23579 and 2013-211354 including specification, claims, drawings and summary is incorporated herein by reference in its entirety.

REFERENCE SIGNS LIST

50 eddy current sensor
54 output signal processing circuit
60 pot core
72 first exciting coil
73 first detecting coil
74 first dummy coil
77 bridge circuit
100 polishing table
101 polishing pad
110 top ring head
180 first detector
182 second detector
246 endpoint detection controller
61*a* floor part
61*b* magnetic core part
61*c* wall part
61*d* peripheral magnetic material
860 second central exciting coil
862 second peripheral exciting coil
864 second central detecting coil
866 second peripheral detecting coil
868 second central dummy coil
870 second peripheral dummy coil

What is claimed is:

1. An eddy current sensor comprising a first detector that detects an eddy current generated in a detection target and a second detector that detects the eddy current, wherein
   the first detector includes a first exciting coil configured to generate the eddy current and a first detecting coil configured to detect the eddy current,
   the first exciting coil and the first detecting coil are air-core coils or coils with a core of a nonmagnetic material,
   the second detector includes a second exciting coil configured to generate the eddy current and a second detecting coil configured to detect the eddy current, and
   the second exciting coil and the second detecting coil are coils with a core of a magnetic material,
   wherein the first detector is disposed peripherally around the second detector.

2. The eddy current sensor according to claim 1, wherein a central axis of the first exciting coil, a central axis of the first detecting coil, a central axis of the second exciting coil, and a central axis of the second detecting coil are aligned.

3. The eddy current sensor according to claim 1, wherein the first exciting coil and the first detecting coil are coils obtained by winding a conductor in a single column with multiple layers or in multiple columns with multiple layers, a column being defined as a direction perpendicular to the detection target, a layer being defined as a direction parallel to the detection target.

4. The eddy current sensor according to claim 1, wherein the first exciting coil and the first detecting coil are a same coil, or the second exciting coil and the second detecting coil are a same coil.

5. An eddy current sensor comprising:
a first detector that detects an eddy current generated in a detection target and a second detector that detects the eddy current, wherein
the first detector includes a first exciting coil configured to generate the eddy current and a first detecting coil configured to detect the eddy current,
the first exciting coil and the first detecting coil are air-core coils or coils with a core of a nonmagnetic material,
the second detector includes a second exciting coil configured to generate the eddy current and a second detecting coil configured to detect the eddy current, and
the second exciting coil and the second detecting coil are coils with a core of a magnetic material, wherein
the first detector is disposed between the detection target and the second detector.

6. An eddy current sensor comprising:
a first detector that detects an eddy current generated in a detection target and a second detector that detects the eddy current, wherein
the first detector includes a first exciting coil configured to generate the eddy current and a first detecting coil configured to detect the eddy current,
the first exciting coil and the first detecting coil are air-core coils or coils with a core of a nonmagnetic material,
the second detector includes a second exciting coil configured to generate the eddy current and a second detecting coil configured to detect the eddy current, and
the second exciting coil and the second detecting coil are coils with a core of a magnetic material, wherein
the core of the magnetic material includes
a bottom magnetic material,
a central magnetic material provided in a center of the bottom magnetic material, and
a peripheral magnetic material provided on a periphery of the bottom magnetic material,
the second exciting coil includes a second central exciting coil disposed at the central magnetic material, and
the second detecting coil includes a second central detecting coil disposed at the central magnetic material.

7. The eddy current sensor according to claim 6, wherein the second exciting coil includes a second peripheral exciting coil disposed at the peripheral magnetic material, and the second detecting coil includes a second peripheral detecting coil disposed at the peripheral magnetic material.

8. The eddy current sensor according to claim 6, wherein the bottom magnetic material has a rod shape, and the peripheral magnetic material is disposed at both ends of the rod shape.

9. A film thickness detection method using an eddy current sensor, the eddy current sensor comprising a first detector that detects an eddy current generated in a detection target and a second detector that detects the eddy current, wherein the first detector includes a first exciting coil configured to generate the eddy current and a first detecting coil configured to detect the eddy current, the first exciting coil and the first detecting coil are air-core coils or coils with a core of a nonmagnetic material, the second detector includes a second exciting coil configured to generate the eddy current and a second detecting coil configured to detect the eddy current, and the second exciting coil and the second detecting coil are coils with a core of a magnetic material, the film thickness detection method comprising:
obtaining a film thickness by detecting the eddy current with the first detector when an electrical resistance of the detection target is less than a predetermined value; and
obtaining the film thickness by detecting the eddy current with the second detector when the electrical resistance of the detection target is greater than the predetermined value.

10. A film thickness detection method using an eddy current sensor, the eddy current sensor comprising a first detector that detects an eddy current generated in a detection target and a second detector that detects the eddy current, wherein the first detector includes a first exciting coil configured to generate the eddy current and a first detecting coil configured to detect the eddy current, the first exciting coil and the first detecting coil are air-core coils or coils with a core of a nonmagnetic material, the second detector includes a second exciting coil configured to generate the eddy current and a second detecting coil configured to detect the eddy current, and the second exciting coil and the second detecting coil are coils with a core of a magnetic material, the film thickness detection method comprising:
obtaining a film thickness by detecting the eddy current with the first detector when the film thickness of the detection target is greater than a predetermined value; and
obtaining the film thickness by detecting the eddy current with the second detector when the film thickness of the detection target is less than the predetermined value.

* * * * *